(12) United States Patent
Han et al.

(10) Patent No.: US 7,652,336 B2
(45) Date of Patent: Jan. 26, 2010

(54) SEMICONDUCTOR DEVICES AND METHODS OF MANUFACTURE THEREOF

(75) Inventors: Jin-Ping Han, Fishkill, NY (US);
Thomas W. Dyer, Pleasant Valley, NY (US); Henry Utomo, Newburgh, NY (US); Rajendran Krishnasamy, Essex Junction, VT (US)

(73) Assignees: International Business Machines Corporation, Armonk, NY (US);
Infineon Technologies AG, Neubiberg (DE)

( * ) Notice: Subject to any disclaimer, the term of this patent is extended or adjusted under 35 U.S.C. 154(b) by 161 days.

(21) Appl. No.: 11/834,398

(22) Filed: Aug. 6, 2007

(65) Prior Publication Data

US 2009/0039442 A1    Feb. 12, 2009

(51) Int. Cl.
*H01L 29/78* (2006.01)
(52) U.S. Cl. .................. 257/384; 257/288; 257/296; 257/301; 438/270
(58) Field of Classification Search ............... 257/118, 257/244, 328–333, 466, 513, 594; 438/42, 438/242–244, 268–274, 386–392
See application file for complete search history.

(56) References Cited

U.S. PATENT DOCUMENTS 6,893,937 B1 * 5/2005 Gu et al. ................. 438/424
7,005,358 B2 * 2/2006 Kammler et al. ........... 438/303
7,208,362 B2 * 4/2007 Chidambaram ............ 438/199
2005/0059260 A1 * 3/2005 Bu et al. .................. 438/775
2005/0179111 A1 * 8/2005 Chao ....................... 257/510

FOREIGN PATENT DOCUMENTS

JP    2007110098 A  *  4/2007

OTHER PUBLICATIONS

Wolf et al., "Silicon Processing for the VLSI Era" vol. 2—Process Integration, p. 215.*
Brigham Young University "List of Thermal Oxide Physical Constants" http://www.ee.byu.edu/cleanroom/OxideTimeCalc.phtml.*

* cited by examiner

*Primary Examiner*—Wai-Sing Louie
*Assistant Examiner*—Sue Tang
(74) *Attorney, Agent, or Firm*—Slater & Matsil, L.L.P.

(57) ABSTRACT

Semiconductor devices and methods of manufacture thereof are disclosed. In a preferred embodiment, a method of manufacturing a semiconductor device includes providing a semiconductor wafer, forming at least one isolation structure within the semiconductor wafer, and forming at least one feature over the semiconductor wafer. A top portion of the at least one isolation structure is removed, and a liner is formed over the semiconductor wafer, the at least one feature, and the at least one isolation structure. A fill material is formed over the liner. The fill material and the liner are removed from over at least a portion of a top surface of the semiconductor wafer.

29 Claims, 4 Drawing Sheets

SEMICONDUCTOR DEVICES AND METHODS OF MANUFACTURE THEREOF

TECHNICAL FIELD

The present invention relates generally to the fabrication of semiconductor devices, and more particularly to the fabrication of transistors.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is used frequently in semiconductor devices. There may be millions of transistors on a single integrated circuit (IC), for example. A common type of transistor used in semiconductor device fabrication is a metal oxide semiconductor field effect transistor (MOSFET), as an example. A transistor typically includes a gate dielectric disposed over a channel region in a substrate, and a gate electrode formed over the gate dielectric. A source region and a drain region are formed on either side of the channel region within the substrate.

In some transistor applications, it is desirable to introduce stress in the channel region of the transistor, in order to increase the mobility of semiconductor carriers such as electrons and holes. One method used to induce strain is embedded SiGe (eSiGe), which involves creating a recess in the source and drain regions of a MOS transistor, and growing a SiGe film within the recess in lieu of conventional silicon source and drain regions. The larger crystal lattice of the eSiGe creates stress in the channel region between the source and drain regions, enhancing carrier mobility. However, device shorts and junction leakage may result when a silicide is later formed on eSiGe source and drain regions.

Thus, what are needed in the art are improved methods of fabricating transistors and structures thereof.

SUMMARY OF THE INVENTION

These and other problems are generally solved or circumvented, and technical advantages are generally achieved, by preferred embodiments of the present invention, which provide novel methods of manufacturing semiconductor devices and transistors, and structures thereof.

In accordance with a preferred embodiment of the present invention, a method of manufacturing a semiconductor device includes providing a semiconductor wafer, forming at least one isolation structure within the semiconductor wafer, and forming at least one feature over the semiconductor wafer. The method includes removing a top portion of the at least one isolation structure, forming a liner over the semiconductor wafer, the at least one feature, and the at least one isolation structure, and forming a fill material over the liner. The fill material and the liner are removed from over at least a portion of a top surface of the semiconductor wafer.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1, 2A, and 2B through 8 show cross-sectional views of a semiconductor device at various stages of manufacturing in accordance with a preferred embodiment of the present invention, wherein recessed shallow trench isolation (STI) regions of a transistor are re-filled with a liner and a fill material in an early eSiGe scheme;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
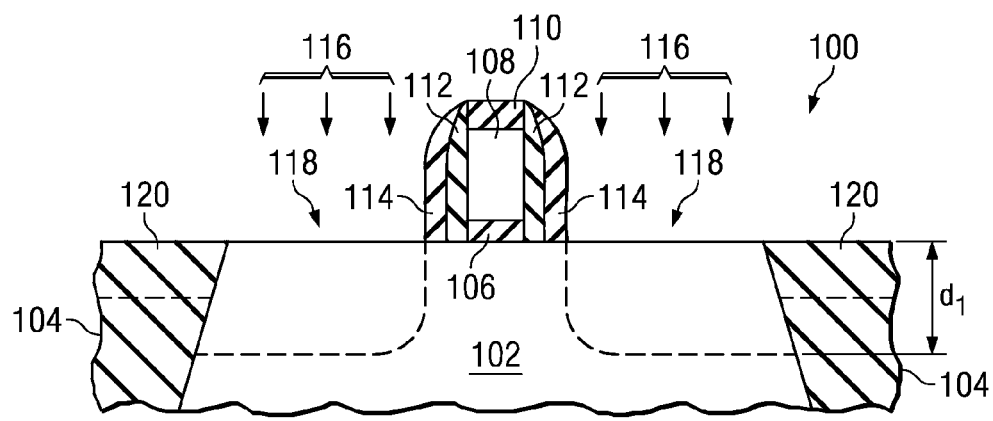

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in specific contexts, namely implemented in single transistor device applications. Embodiments of the invention may also be implemented in other semiconductor applications such as memory devices, logic devices, and other applications that utilize transistor devices, for example. Embodiments of the invention may also be implemented in structures in which isolation structures are recessed and it is desirable to re-fill the isolation structures, as another example.

In some transistor applications, eSiGe is used to form the source and drain regions to create stress in the channel region. However, eSiGe source and drain regions may comprise faceted surfaces that may cause shorts in undesired locations and that may result in junction leakage when a silicide is subsequently formed over the source and drain regions.

Another problem in transistor fabrication is that STI regions and other isolation structures used to provide isolation between adjacent devices may inadvertently become recessed during the processing of the transistors. The recesses in the STI regions may also result in shorts and junction leakage when silicide is subsequently formed over the source and drain regions.

Thus, what are needed in the art are improved methods of manufacturing transistors and structures thereof.

Embodiments of the present invention achieve technical advantages by providing novel methods of avoiding shorts and junction leakage during silicide formation over source and drain regions of transistors. After the formation of at least one sidewall spacer over a gate dielectric and gate, a liner is formed over the sidewall spacers, the gate, source and drain regions, and STI regions. A fill material is formed over the liner. The fill material is removed from above a top surface of the liner, e.g., at least above the top surface of a workpiece. The liner and the fill material re-fill recessed STI regions of the semiconductor device.

FIGS. 1, 2A, and 2B through 8 show cross-sectional views of a semiconductor device 100 at various stages of manufacturing in accordance with a preferred embodiment of the present invention implemented in an early eSiGe scheme of manufacturing a transistor. To manufacture the semiconductor device 100, first, a workpiece 102 is provided. The workpiece 102 may include a semiconductor substrate or wafer comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a bulk Si substrate, a silicon-on-insulator (SOI), a germanium-on-insulator (GOI) substrate, or other types of substrates, as examples.

Isolation regions 104 are formed in the workpiece 102. The isolation regions 104 are also referred to herein as isolation structures, for example. The isolation regions 104 may comprise shallow trench isolation (STI) regions in some preferred embodiments, for example. The isolation regions 104 may alternatively comprise deep trench (DT) isolation regions, field oxide isolation regions, or other types of insulating regions, as examples. The isolation regions 104 may be formed by depositing a hard mask (not shown) over the workpiece 102 and forming trenches in the workpiece 102 and the hard mask using a lithography process. For example, the isolation regions 104 may be formed by depositing a photoresist, patterning the photoresist using a lithography mask and an exposure process, developing the photoresist, removing portions of the photoresist, and then using the photoresist and/or hard mask to protect portions of the workpiece 102 while other portions are etched away, forming trenches in the workpiece 102. The photoresist is removed, and the trenches are then filled with an insulating material such as an oxide or nitride, or multiple liners, layers and combinations thereof, as examples. The hard mask may then be removed. Alternatively, the isolation regions 104 may be formed using other methods and may be filled with other materials. The insulating material within the isolation regions 104 is also referred to herein as a first fill material, for example.

The isolation regions 104 may comprise a depth within a top surface of the workpiece 102 of about 200 nm or less, and may comprise a width of about 200 to 300 nm, although alternatively, the isolation regions 104 may comprise other dimensions. The isolation regions 104 may comprise a length, e.g., in an out of the paper, of several hundred nanometers to about 1 μm or greater, as an example, although alternatively, the isolation regions 104 may comprise other dimensions. As another example, the isolation regions 104 may be round in a top view rather than rectangular or oval.

A gate dielectric material 106 is deposited over the workpiece 102 and the isolation regions 104. The gate dielectric material 106 preferably comprises about 200 Angstroms or less of an oxide such as $SiO_2$, a nitride such as $Si_3N_4$, a high-k dielectric material having a dielectric constant greater than about 3.9, such as $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, or combinations and multiple layers thereof, as examples. Alternatively, the gate dielectric material 106 may comprise other dimensions and materials, for example. The gate dielectric material 106 may be formed using chemical vapor deposition (CVD), atomic layer deposition (ALD), metal organic chemical vapor deposition (MOCVD), physical vapor deposition (PVD), or jet vapor deposition (JVD), as examples, although alternatively, other methods may also be used.

A gate material 108 is deposited over the gate dielectric material 106. The gate material 108 preferably comprises an electrode material. The gate material 108 preferably comprises a thickness of about 1,500 Angstroms or less, for example. The gate material 108 preferably comprises a semiconductor material, such as polysilicon or amorphous silicon; a metal such as TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, TaC, TaCN, TaCNO, or other metals; a partially or fully silicided gate material (FUSI), having a silicide layer comprised of titanium silicide, nickel silicide, tantalum silicide, cobalt silicide, or platinum silicide; and/or combinations or multiple layers thereof, as examples. The gate material 108 may comprise a variety of different stoichiometry combinations for the components of the exemplary metals listed, for example. Alternatively, the gate material 108 may comprise other dimensions and materials, for example. The gate material 108 may be formed by CVD, PVD, or other suitable deposition methods, for example. The gate material 108 may optionally be implanted with dopants; e.g., the gate material 108 may be predoped or may be doped later, at the same time source and drain regions are implanted with dopants.

A hard mask 110 is deposited over the gate material 108. The hard mask 110 may comprise a nitride material such as silicon nitride, an oxide material such as silicon dioxide, a nitridized oxide, or multiple layers and combinations thereof, for example, although alternatively, the hard mask 110 may comprise other materials. In some embodiments, the hard mask 110 may comprise a trilayer including two nitride layers with an oxide layer disposed between the nitride layers. A plurality of alternating silicon dioxide layers and silicon nitride layers may be used for the hard mask 110, to provide etch selectivity and etch stop layers for subsequent etch processes, for example. The hard mask 110 may prevent the formation of semiconductive material in subsequent processing steps over the gate material 108, for example. The hard mask 110 preferably comprises about 500 Angstroms or less of silicon nitride and/or silicon dioxide, although alternatively, the hard mask 110 may comprise other dimensions and materials. In a preferred embodiment, the hard mask 110 comprises a nitride cap comprising silicon nitride, as an example.

The hard mask 110, the gate material 108, and the gate dielectric material 106 are patterned using lithography to form a gate 108 and gate dielectric 106 with a patterned hard mask 110 residing on top. For example, a layer of photosensitive material (not shown) comprising a photoresist, for example, may be deposited over the hard mask 110. The layer of photosensitive material is patterned with the desired pattern for the gate 108 and gate dielectric 106, and the patterned layer of photosensitive material and optionally also the hard mask 110 are used as a mask to pattern the gate 108 and the gate dielectric 106, leaving the patterned hard mask 110, gate 108, and gate dielectric 106, as shown in FIG. 1. The layer of photosensitive material is then removed. The patterned gate 108, gate dielectric 106, and optionally also the patterned hard mask 110 are also referred to herein as a feature, for example.

The gate 108 may comprise a width or a gate length of about 35 to 42 nm in some embodiments, for example. The gate 108 may extend lengthwise, e.g., in and out of the paper, by about 500 nm. Alternatively, the gate 108 may comprise other dimensions depending on the particular application and the technology node used for the manufacturing of the semiconductor device 100, for example.

The workpiece 102 may be lightly doped with a dopant species to form lightly doped regions (not shown) in a top surface of the workpiece 102 proximate the gate 108 and gate dielectric 106, after the patterning of the hard mask 110, gate 108, and the gate dielectric 106. Other implantation processes (e.g., pocket implants, halo implants, or double-diffused regions) may optionally also be performed as desired after the patterning of the gate 108 and gate dielectric 106, for example. However, in accordance with some embodiments of the present invention, implantation processes may not be required.

A first sidewall spacer material 112 is formed over the top surface of the hard mask 110, the workpiece 102, and the isolation regions 104, and over the sidewalls of the gate 108, gate dielectric 106, and hard mask 110. The first sidewall spacer material 112 may comprise one or more liners and may comprise two or more layers of insulating material, e.g., such as silicon nitride, silicon oxide, and/or silicon oxynitride, although other materials may also be used. The first sidewall spacer material 112 preferably comprises an oxide liner having a thickness of about 30 Angstroms in some embodiments, for example. Alternatively, the first sidewall spacer material 112 may comprise a nitride, oxynitride, or other materials, as examples, and may comprise other dimensions.

The first sidewall spacer material 112 is preferably substantially conformal as-deposited. The first sidewall spacer material 112 is preferably etched using an anisotropic or directional etch process, leaving first sidewall spacers 112 on the sidewalls of the gate 108, gate dielectric 106, and hard mask 110, as shown in FIG. 1. The anisotropic etch process removes the first sidewall spacer material 112 from the top surfaces of the hard mask 110, the workpiece 102, and the isolation regions 104, leaving the first sidewall spacers 112 on the sidewalls of the hard mask 110, gate 108, and gate dielectric 106. The first sidewall spacers 112 may comprise downwardly-sloping sidewalls as shown due to the anisotropic etch process, for example. The first sidewall spacers 112 may comprise a thickness along the sidewalls of the gate 108 of about 30 Angstroms, although alternatively, the first sidewall spacers 112 may comprise other dimensions. After the formation of the first sidewall spacers 112, optionally, the workpiece 102 may be implanted with a deep implantation of a dopant species proximate the first sidewall spacers 112, not shown.

A disposable sidewall spacer material 114 is formed over the top surface of the hard mask 110, the workpiece 102, the isolation regions 104, and over sidewalls of the first sidewall spacers 112. The disposable sidewall spacer material 114 may comprise one or more liners and may comprise two or more layers of insulating material, e.g., such as silicon nitride, silicon oxide, and/or silicon oxynitride, although other materials may also be used. The disposable sidewall spacer material 114 preferably comprises a nitride liner having a thickness of about 30 Angstroms in some embodiments, for example. Alternatively, the disposable sidewall spacer material 114 may comprise an oxide, oxynitride, or other materials, as examples, and may comprise other dimensions.

In some embodiments, the disposable sidewall spacer material 114 preferably comprises the same material as the hard mask 110 material, for example, so that the disposable sidewall spacer material 114 and the hard mask 110 will be removed using the same etch process. The hard mask 110 is preferably thicker than the disposable sidewall spacer material 114 in these embodiments so that a portion of the hard mask 110 will be left remaining after the etch process to form the disposable sidewall spacers 114, for example. In other embodiments, the hard mask 110 preferably comprises a material that is etchable using the same etch process used to form the disposable sidewall spacers 114, as another example.

The disposable sidewall spacer material 114 is preferably substantially conformal as-deposited. The disposable sidewall spacer material 114 is preferably etched using an anisotropic or directional etch process, leaving disposable sidewall spacers 114 on the sidewalls of the first sidewall spacers 112 on sidewalls of the hard mask 110, gate 108, and gate dielectric 106, as shown in FIG. 1. The anisotropic etch process removes the disposable sidewall spacer material 114 from the top surfaces of the hard mask 110, the workpiece 102, and the isolation regions 104, leaving disposable sidewall spacers 114 on the sidewalls of the hard mask 110, gate 108, and gate dielectric 106. The disposable sidewall spacers 114 may comprise downwardly-sloping sidewalls as shown in FIG. 1 due to the anisotropic etch process, for example. The disposable sidewall spacers 114 may comprise a thickness along the sidewalls of the gate 108 of about 70 to 90 Angstroms, although alternatively, the disposable sidewall spacers 114 may comprise other dimensions. The disposable sidewall spacers 114 are also referred to herein as temporary sidewall spacers, for example.

After the formation of the disposable sidewall spacers 114, optionally, the workpiece 102 may be implanted with a deep implantation of a dopant species proximate the disposable sidewall spacers 114, not shown. A portion of the hard mask 110 may be removed during the anisotropic etch process of the disposable sidewall spacers 114, for example. A channel region of a transistor is formed in the workpiece 102 beneath the gate 108, e.g., beneath the gate dielectric 106.

In accordance with preferred embodiments of the present invention, exposed portions of the workpiece 102 are then recessed using an etch process 116, as shown in FIG. 1. The etch process 116 preferably comprises an anisotropic etch process in accordance with an embodiment of the present invention, for example. The etch process 116 may comprise a wet or dry etch process, or combinations thereof, for example. The etch process 116 may comprise a reactive ion etch (RIE) process, as another example.

The etch process 116 is preferably adapted to remove the workpiece 102 material and not the isolation region 104 material, hard mask 110, or disposable sidewall spacers 114, forming recesses 118 in the workpiece 102 proximate at least one side of the gate 108 and the gate dielectric 106. For example, the recesses 118 are preferably formed proximate a first side and a second side of the gate 108 and gate dielectric 106, as shown in FIG. 1 in phantom. The recesses 118 preferably comprise a depth beneath the top surface of the workpiece 102 comprising a dimension $d_1$ of about 200 nm or less, for example. In some embodiments, for example, the recesses 118 may more preferably comprise a depth or dimension $d_1$ beneath the top surface of the workpiece 102 of about 60 to 80 nm, as another example. The recesses 118 preferably comprise a width of about 900 nm to 1 µm or less in some embodiments, as another example. Alternatively, the recesses 118 may comprise other dimensions. The recesses 118 may comprise substantially oval, round, square, rectangular, triangular, or trapezoidal shapes, as examples, although alternatively, the recesses 118 may comprise other shapes.

The recesses 118 comprise two holes in the top surface of the workpiece 102 formed on both sides of the gate 108 and the gate dielectric 106. Only two recesses 118 are shown in the figures; however, alternatively, preferably a plurality of recesses 118 are simultaneously formed (e.g., a plurality of transistors are preferably formed at once across the workpiece 102).

Advantageously, because the etch process 116 is preferably adapted not to remove a substantial amount of the STI regions 104, the hard mask 110, or the disposable sidewall spacers 114, a masking material and lithography process may not be required to form the recesses 118. Alternatively, portions of the workpiece 102 may be masked (not shown) while the region of the workpiece 102 the transistor will be formed in is etched with the etch process 116, for example. In some embodiments, some transistor regions may be blocked or masked while others are recessed using the etch process 116. For example, a plurality of n channel metal oxide semiconductor (NMOS) field effect transistor (FET) regions may be masked while a plurality of p channel metal oxide semiconductor (PMOS) field effect transistor (FET) regions are recessed using the etch process 116, or vice versa.

The etch process 116 preferably comprises a directional, anisotropic etch process, so that portions of the workpiece 102 are removed having substantially vertical sidewalls, e.g., beneath the sidewalls of the disposable sidewall spacers 114, as shown in phantom in FIG. 1.

Note that a top portion of the isolation regions 104 may be recessed during the etch process 116 of the source and drain regions, during the etch processes to form the first sidewall spacers 112 and disposable sidewall spacers 114, or during other etch processes and/or cleaning processes of the semiconductor device 100, as shown in phantom in FIG. 1 at 120. The isolation regions 104 may be inadvertently or unintentionally recessed, e.g., during the etch process 116 of the source and drain regions, during another etch process for the semiconductor device 100, or for a cleaning process for the semiconductor device 100, as examples. The amount of the recess of the isolation region may comprise a dimension $d_2$ of about 50 nm or less, for example.

Alternatively, the isolation regions 104 may be intentionally recessed using an etch process for another material layer of the semiconductor device 100, or using an additional etch process in the manufacturing process flow that is designed to remove the top portion 120 of the isolation regions 104, as example. If the isolation regions 104 are intentionally recessed using an additional etch process, then the isolation regions 104 may be recessed deeper than if the isolation regions 104 are unintentionally recessed. The isolation regions 104 may be intentionally recessed by a dimension $d_2$ comprising about half of the depth of the isolation regions 104, as an example, although alternatively, the isolation regions 104 may be recessed by other amounts.

Figure 2A:
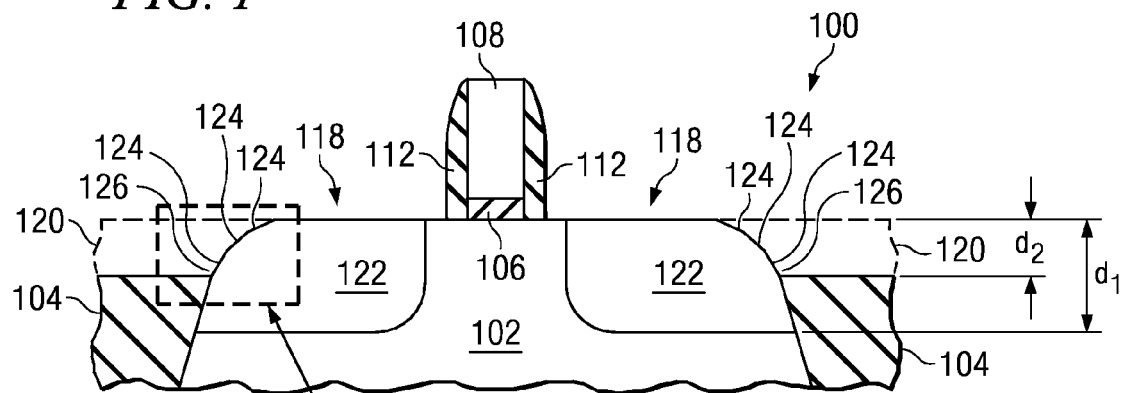

Next, in accordance with an embodiment of the present invention, the recesses 118 in the workpiece 102 are filled with a semiconductive material 122, as shown in FIG. 2A. The semiconductive material 122 preferably comprises a compound semiconductor material 122 including two or more semiconductor elements or a semiconductor element combined with another type of element other than a semiconductor, for example. The semiconductive material 122 may comprise a doped semiconductive material, as another example. The semiconductive material 122 may also comprise an undoped semiconductive material. The semiconductive material 122 may be epitaxially grown and may be doped using a subsequent implantation step, for example. Alternatively, the recesses 118 may be filled using an in-situ doping process of doped semiconductive material, e.g., wherein the semiconductive material 122 is doped as the recesses 118 are filled. In some embodiments, the semiconductive material 122 is preferably epitaxially grown and is in-situ doped during the epitaxial growth process, as another example.

The semiconductive material 122 preferably comprises SiGe, carbon-doped SiGe, or SiC, in some embodiments, although other materials may also be used. The semiconductive material 122 is preferably selected to achieve the amount and type of stress desired for the particular transistor 150 device (see FIG. 8) being manufactured, for example. The semiconductive material 122 may be doped with a p-type dopant or an n-type dopant depending on the application, for example.

If the transistor 150 comprises a PMOS FET, filling the recesses 118 in the workpiece 102 with a semiconductive material 122 preferably comprises epitaxially growing SiGe. The semiconductive material 122 may be doped with an n-type dopant such as As, C, P, or combinations thereof, as an example. Alternatively, other semiconductive materials and dopant elements may also be used. The compound semiconductive material 122 increases the tensile stress of the source region and the drain region of the transistor 150 in these embodiments, which creates compressive stress on the channel region that is disposed between the source and drain regions comprised of the semiconductive material 122, for example.

As another example, if the transistor 150 comprises an NMOS FET, the recesses 118 in the workpiece 102 are preferably filled with a semiconductive material 122 that preferably comprises epitaxially grown SiC that may be doped with a p-type dopant such as B. Alternatively, other semiconductive materials and dopant elements may also be used. The compound semiconductive material 122 increases the compressive stress of the source region and the drain region of the transistor 150 in these embodiments, which creates tensile stress on the channel region between the source and drain regions comprised of the semiconductive material 122, for example.

The semiconductive material 122 preferably completely fills the recesses 118 in the entire amount of the depth beneath the top surface of the workpiece 102 comprising the dimension $d_1$ of about 200 nm or less, for example, as shown.

The semiconductive material 122 preferably comprises a compound semiconductor material comprising silicon (Si) and at least one other element, for example. The other element(s) of the semiconductive material 122 preferably comprises an atom having a different size than Si and/or a different atom size than the material of the workpiece 102, so that stress is created in the semiconductive material 122 that is bounded by the workpiece 102 and STI regions 104, for example. The semiconductive material 122 preferably comprises a material adapted to alter a stress of the workpiece 102 in a region of the workpiece 102 proximate the semiconductive material 122 in some embodiments. In some embodiments, for example, the semiconductive material 122 is preferably adapted to alter the stress of the adjacent channel region disposed between source and drain regions comprising the semiconductive material 122. The semiconductive material 122 may also comprise other materials, e.g., that may or may not affect the stress of the adjacent workpiece 102.

The semiconductive material 122 is preferably epitaxially grown in some embodiments. The semiconductive material 122 preferably forms only on the exposed, recessed surfaces of the workpiece 102 in the epitaxial growth process. The hard mask 110 shown in FIG. 1 may be left remaining over the gate 108 to prevent the semiconductive material 122 from epitaxially growing over the gate 108, which may comprise the same material as the workpiece 102, for example, not shown. Alternatively, the semiconductive material 122 may be deposited, using ALD, PVD, CVD, or other deposition methods, for example, and the semiconductive material 122 may be patterned to remove the semiconductive material 122 from over the isolation regions 104, the hard mask 110, the disposable sidewall spacers 114, and other undesired regions of the workpiece 102.

If an epitaxial process is used to form the semiconductive material 122, for example, the workpiece 102 may be placed in a processing chamber, and then gas sources may be introduced into the processing chamber to epitaxially grow the semiconductive material 122 to fill the recesses 118. A first gas source comprising Si (e.g., $SiH_4$ or $SiH_2Cl_2$) and a second gas source comprising Ge (e.g., $GeH_4$) and/or C (e.g., $CH_3Si$) may be introduced into the processing chamber to form SiGe or SiC, for example. Alternatively, other gas sources may be used, and other gases may be included in the gas mixture, such as carrier gases and dopant source gases. An example of a carrier gas is HCl and an example of a p-type dopant source is $B_2H_6$, although alternatively, other gases may be used. If a dopant source gas is not included in the gas mixture, the source and drain regions 122 may optionally be doped later using an implantation step, for example.

Advantageously, if an epitaxial process is used to form the semiconductive material 122, a lithography process to remove undesired semiconductive materials 122 may be avoided, because the semiconductive material 122 only forms on the exposed portions of the workpiece 102 in the recesses 118, for example. Thus, the number of lithography steps and lithography mask sets required to manufacture the semiconductor device 100 may be reduced.

Next, the disposable sidewall spacer 114 may be removed using an etch process adapted to remove the disposable sidewall spacer 114 material, leaving the structure shown in FIG. 2A. Because in some embodiments, the disposable sidewall spacer material 114 and the hard mask 110 both comprise silicon nitride, the hard mask 110 may also be removed during the etch process to remove the disposable sidewall spacers 114, as shown in FIG. 2A. However, in some embodiments, the disposable sidewall spacer 114 may be left remaining in the structure to function as a second sidewall spacers, for example.

Note that the structure shown in FIG. 2A comprises regions that may cause shorts if a silicide were formed over the source and drain regions 122 at this point in the manufacturing process flow. For example, because the STI regions 104 are recessed, as shown at recessed regions 120, growing a silicide may cause shorts at the edges of the STI regions 104, e.g., at 126.

Furthermore, the source and drain regions 122 comprised of the semiconductive material 122 may comprise faceted surfaces 124 proximate the STI regions 104. The faceted surfaces 124 are shown in a more detailed view in FIG. 2B, for example. The faceted surfaces 124 may form due to the epitaxial growth process of the semiconductive material 122, due to the crystalline properties of the semiconductive material 122, for example. The faceted surfaces 124 may comprise angled downwardly sloping sidewalls, e.g., that slope downwardly towards the STI regions 104. The faceted surfaces 124 of the source and drain regions 122 further increase the likelihood that shorts would form at 126 if a silicide were formed over the source and drain regions 122 at this point in the manufacturing process flow, for example.

Figure 2B:
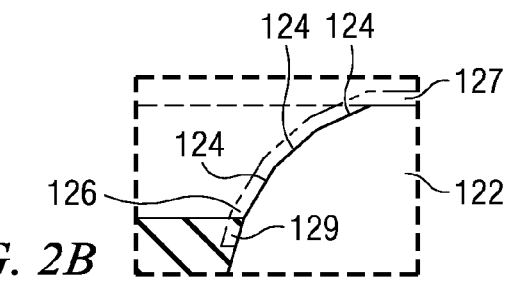

FIG. 2B shows in phantom a wrap-around effect of silicide 127 that may occur due to the recessed STI regions 104 and/or due to the faceted surfaces 124 of the source and drain regions 122 if a silicide 127 were to be formed at this point in the manufacturing process over the source and drain regions 122. The silicide 127 may encroach downwardly into the workpiece 102 in regions 126, resulting in a portion 129 of the silicide 127 forming beneath a top surface of the STI regions 104, which may deleteriously affect device performance and may result in device failures.

Figure 3:
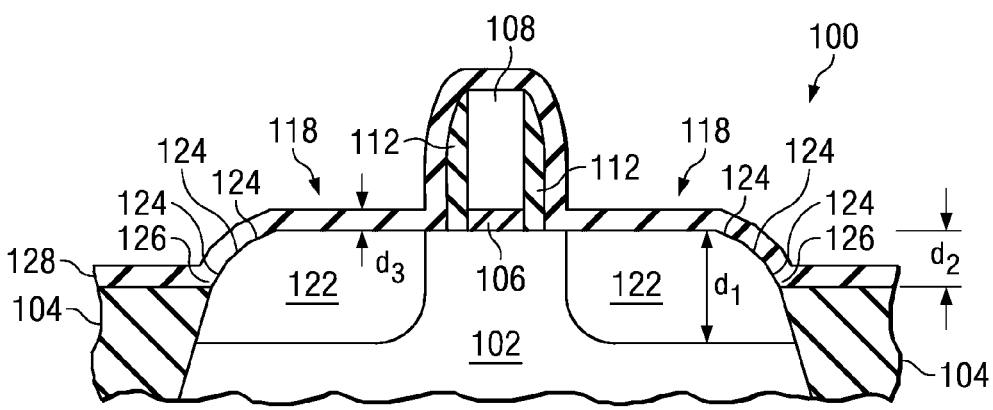
Figure 4:
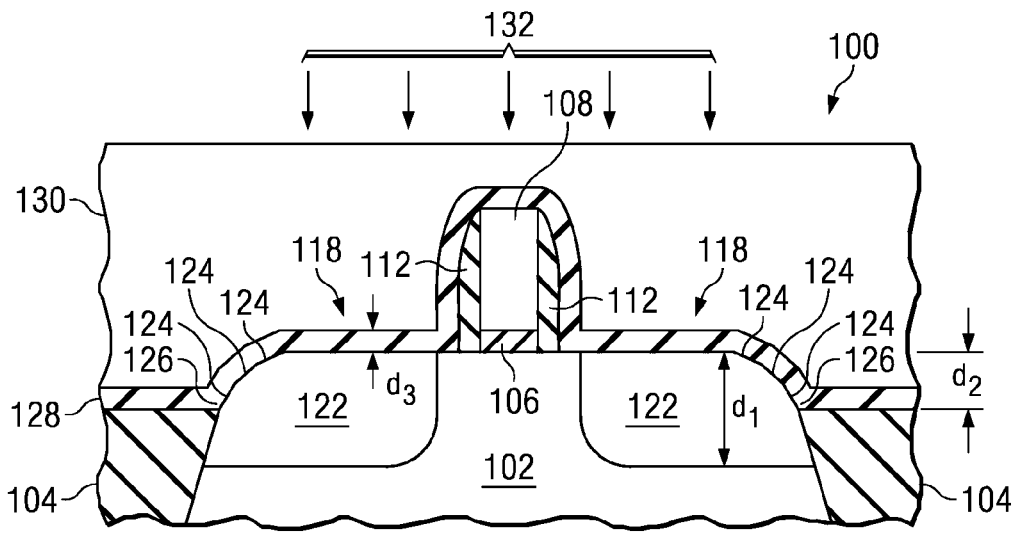

Embodiments of the present invention achieve technical advantages by refilling the recessed regions 120 of the STI regions 104 with a liner 128 as shown in FIG. 3 and a fill material 130 as shown in FIG. 4, before the formation of a silicide over the source and drain regions 122, to be described further herein. Excess amounts of the liner 128 and the fill material 130 are then removed from at least a portion of the top surface of the workpiece 102, as shown in FIGS. 4, 5, 6, and 7.

Referring next to FIG. 3, a liner 128 is formed over the source and drain regions 122, the top surface of the gate 108, the first sidewall spacers 122, and the recessed STI regions 104. The liner 128 preferably comprises silicon nitride, a high k dielectric material having a dielectric constant of greater than about 3.9, or amorphous carbon, as examples, although alternatively, the liner 128 may comprise other insulating materials, such as an oxynitride, an oxide, a nitride, multiple layers of these materials, or combinations thereof, for example. The liner 128 preferably comprises a material adapted to function as a chemical-mechanical polish (CMP) or other etch or removal process etch stop material in some embodiments, for example. The liner 128 preferably comprises a thickness or dimension $d_3$ of about 150 Angstroms or less, for example, although alternatively, the liner 128 may comprise other materials. The liner 128 in some embodiments preferably comprises a first layer of silicon dioxide comprising a thickness of about 10 to 50 Angstroms, and a second layer formed over the first layer, wherein the second layer comprises about 100 Angstroms or less of silicon nitride, a high k dielectric material, or amorphous carbon. Alternatively, the liner 128 may comprise other materials and dimensions, for example.

Next, a fill material 130 is formed over the liner 128, as shown in FIG. 4. The fill material 130 preferably comprises an oxide material such as silicon dioxide in some embodiments, for example. The fill material 130 may comprise spin-on-glass (SOG), a low k dielectric material having a dielectric constant of about 3.9 or less, a material formed using a high aspect ratio fill process, or undoped silicate glass (USG), as examples, although alternatively, the fill material 130 may comprise other insulating materials. The fill material 130 is also referred to herein as a second fill material, for example.

A portion of the fill material 130 is preferably formed within the recessed regions (regions 120 in FIGS. 1 and 2) of the STI regions over the liner 128. A top surface of the fill material 130 preferably extends above a top surface of the gate 108, as shown in FIG. 4. The liner 128 and the fill material 130 preferably completely fill the recesses 120 in the STI regions 104, as shown.

Next, the fill material 130 and the liner 128 are removed at least from over a top surface of the workpiece 102. In some embodiments, the removal of the fill material 130 and the liner 128 are preferably performed using several removal steps. For example, in a preferred embodiment, first, a removal process 132 that may comprise a CMP process is used to remove the fill material 130 from over the top surface 134 of the liner 128 on top of the gate 108, as shown in FIG. 4, leaving the structure shown in FIG. 5. The CMP process 132 is preferably adapted to stop when the top surface 134 of the liner 128 on the top of the gate 108 is reached. Alternatively, for example, the removal process 132 may comprise an etch process having an end point detector that is adapted to detect when the top surface 134 of the liner 128 is reached during the removal process 132 for the top portion of the fill material 130, for example.

If the removal process 132 comprises a CMP process, the liner 128 preferably comprises a material and thickness sufficient to withstand the CMP process 132. A top portion of the liner 128 may be removed from over the gate 108 during the CMP process 132, for example.

Figure 5:
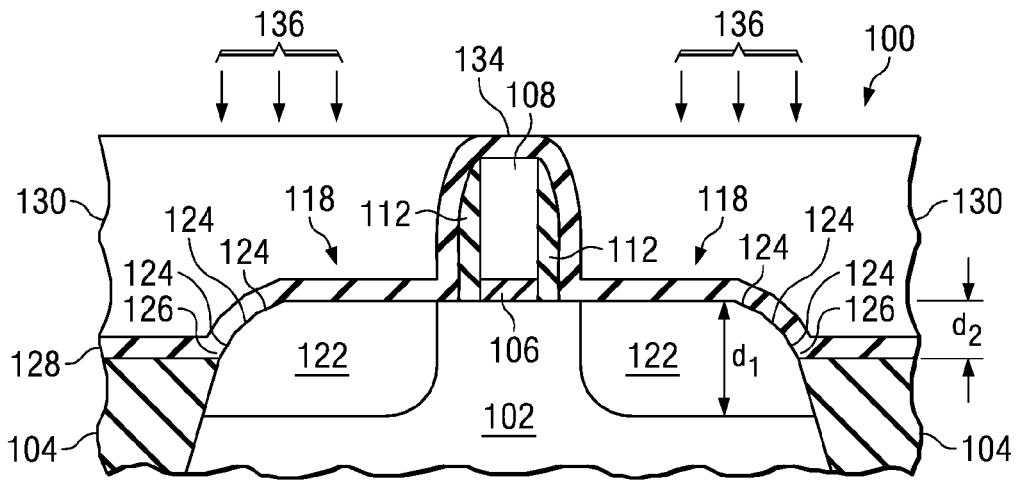
Figure 6:
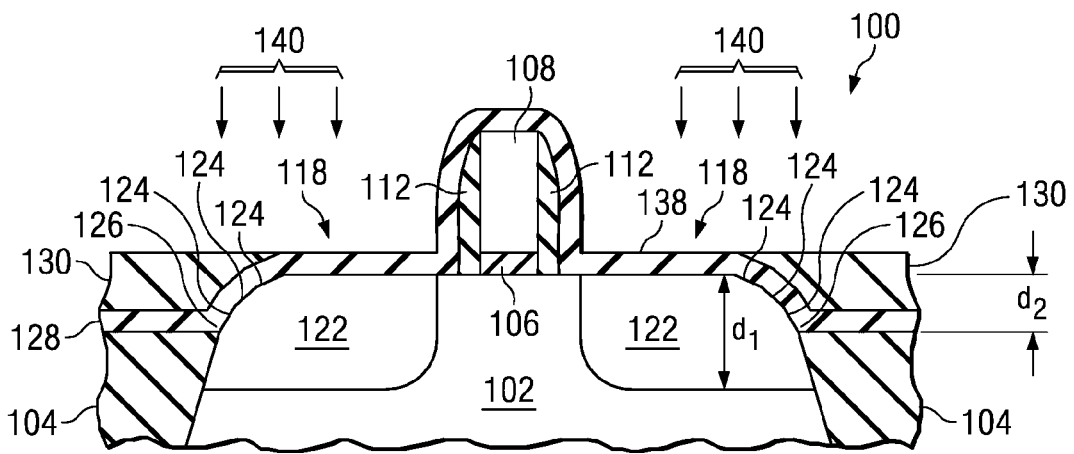

Next, an etch process 136 is used to remove the fill material 130 from over the top surface 138 of the liner 128 over the source and drain regions 122 as shown in FIG. 5, leaving the structure shown in FIG. 6. The etch process 136 is also referred to herein as a first etch process 136, for example. The etch process 136 preferably comprises an etch process adapted to remove the material of the fill material 130, but not the liner 128 material. The first etch process 136 is preferably adapted to etch the fill material 130 selective to the liner 128, for example. The etch process 136 may include an end point detector that may be used to detect when the top surface 138 of the liner 128 is reached over the source and drain regions 122, for example. The first etch process 136 preferably comprises a reactive ion etch (RIE) process in some embodiments, for example.

Figure 7:
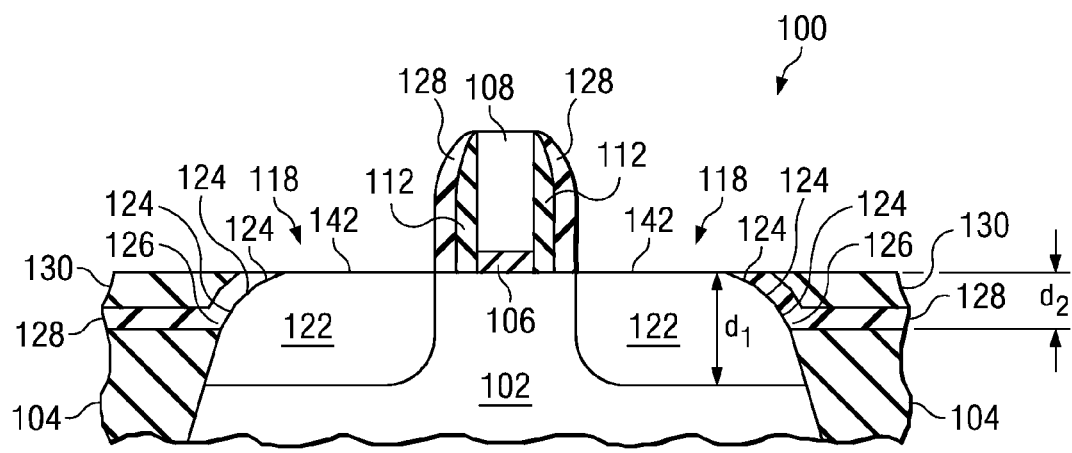
Figure 9:
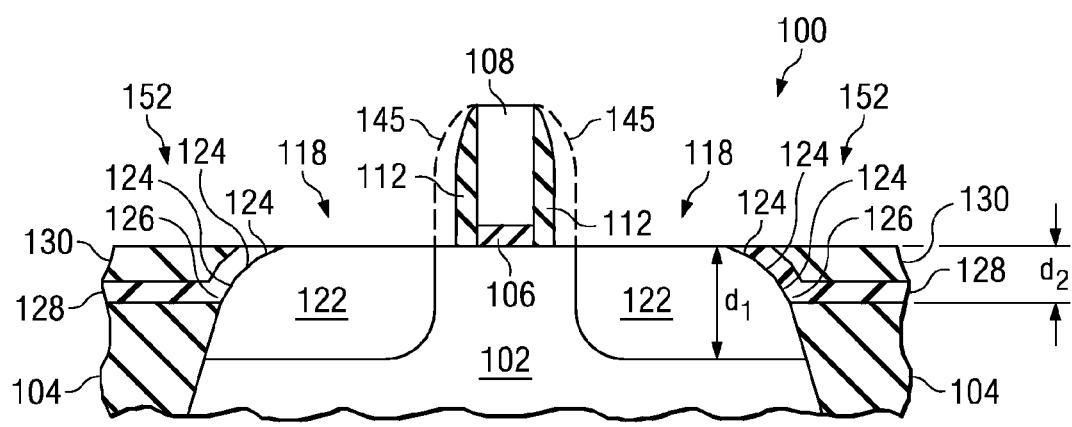
FIG. 9 shows a cross-sectional view of an embodiment of the present invention wherein temporary sidewall spacers of a transistor are replaced with permanent, second sidewall spacers.

An etch process 140 is then used to remove the liner 128 from over the top surface 142 of the source and drain regions 122 as shown in FIG. 6, leaving the structure shown in FIG. 7. The etch process 140 is also referred to herein as a second etch process, for example. The second etch process 140 is preferably adapted to remove the liner 128 material but not a significant amount of the fill material 130, for example. The second etch process 140 is preferably adapted not to remove the gate 108 material or the source and drain region material 122, for example. The second etch process 140 in some embodiments is preferably substantially anisotropic so that the liner 128 is left remaining on sidewalls of the first sidewall spacers 112, as shown in FIG. 7. The liner 128 may function as second sidewall spacers in this embodiment, for example. Alternatively, the second etch process 140 may be substantially isotropic and may result in the removal of all of the liner 128 material from the sidewalls of the first sidewall spacers 112, as shown in FIG. 9, to be described further herein. The second etch process 140 preferably comprises a RIE process in some embodiments, for example.

Advantageously, in accordance with embodiments of the present invention, the recessed regions 120 comprising dimension $d_2$ beneath the top surface of the workpiece 102 of the STI regions 104 are completely filled with the liner 128 and the fill material 130. The liner 128 is formed over the first fill material 104 of the STI regions 104 and over sidewalls of the source and drain regions 122 in the upper portion of the STI regions 104. The recessed regions 120 are also filled with the second fill material 130 above the liner 128, as shown in FIG. 7, after the various removal and etch processes 132, 136, and 140 to remove portions of the liner 128 and the fill material 130 from over the top of the workpiece 102, for example.

Figure 8:
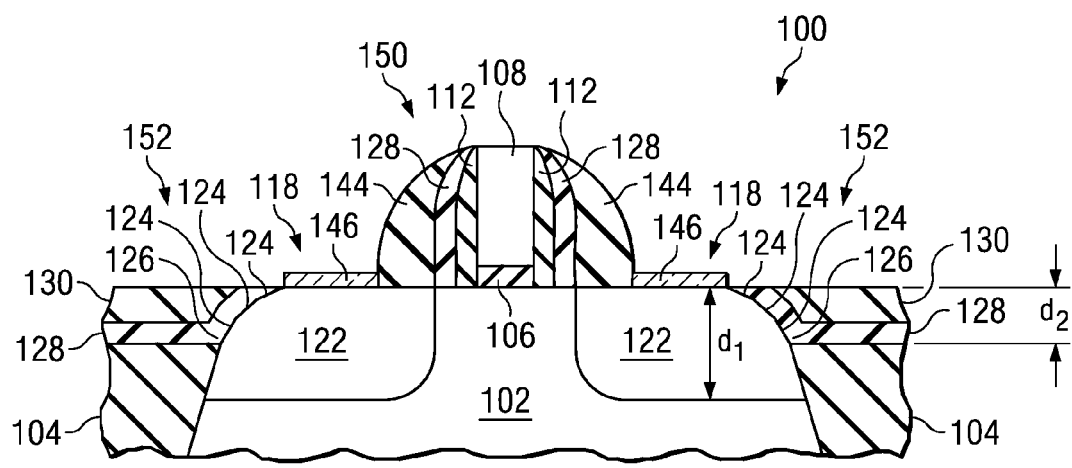

Thus, novel STI regions 152 are formed that comprise the first fill material 104, the liner 128, and the second fill material 130, as shown in FIG. 8, in accordance with embodiments of the present invention.

Next, the manufacturing process for the semiconductor device 100 is then continued to complete the fabrication of the transistor 150, also shown in FIG. 8. For example, the workpiece 102 may be annealed to cause a portion of dopants of the semiconductive material 122 of the source and drain regions to diffuse into the adjacent workpiece 102. As an example, the workpiece 102 may be annealed at a temperature of about 1,000 C or greater. Third sidewall spacers 144 comprising similar materials and/or liners as described for the first and second sidewall spacers 112 and 128 may be formed over the second sidewall spacers 128 that are formed from liner 128, using similar methods as described for the first and second sidewall spacers 112 and 128. The third sidewall spacers 144 may comprise an oxide liner and a nitride material disposed over the oxide liner, for example.

Silicide regions 146 may be formed over the source and drain regions 122, as shown in FIG. 8. The silicide regions 146 may be formed by depositing a silicidation metal over the source and drain regions 122, e.g., over all exposed surfaces of the structure, and then subjecting the workpiece 102 to an annealing process. Silicide may also form over the gate 108 during the silicide process, for example, not shown. The silicidation metal may comprise nickel, cobalt, copper, molybdenum, titanium, tantalum, tungsten, erbium, zirconium, platinum, or combinations thereof, as examples. After the metal is deposited over at least the source and drain regions 122 and optionally also over the gate 108, the workpiece 102 is heated, causing the metal to diffuse into semiconductive material 122 of the source and drain regions and optionally also the gate 108. A silicide region 146 comprising a silicide of the metal is formed over the semiconductive material 122, as shown. After the silicide region 146 is formed, the layer of silicidation metal is then removed from the semiconductor device 100. The silicide regions 146 improve the conductivity and reduce the resistance of the source and drain regions 122 and optionally also the gate 108, for example. The silicide 146 may partially consume the underlying semiconductive material 122, for example, not shown.

Because the recesses 120 (see FIGS. 1 and 2) in the STI regions 104 are re-filled with the liner 128 and fill material 130 in accordance with embodiments of the present invention, advantageously, shorts and junction leakage do not occur when the silicide 146 (refer again to FIG. 8) is formed over the source and drain regions 122, advantageously. Thus, the STI regions 152 provide improved isolation between adjacent devices and/or transistors 150.

An optional stress-inducing nitride layer (not shown) which may also function as a contact etch stop layer may be formed over the transistor 150 at this point in the manufacturing process flow. An interlayer dielectric (ILD) layer (also not shown) may then be formed over the nitride layer. The ILD layer may comprise an insulating material such as borophosphosilicate glass (BPSG), phosphosilicate glass (PSG), boron-doped silicon glass (BSG), organo-silicate glass (OSG), fluorinated silicate glass (FSG), spun-on-glass (SOG), silicon nitride, silicon dioxide, or plasma enhanced tetraethyloxysilane (PETEOS), as examples, although alternatively, the ILD layer may comprise other materials. The ILD layer may be etched to form contact holes using lithography, and source and drain contacts may be formed (not shown) through the ILD layer by depositing conductive material to fill the contact holes and make electrical contact to the silicided 146 source/drain regions 122. Metallization layers (also not shown) may be formed above the ILD layer and the source and drain contacts to interconnect the various components of the semiconductor device 100. Other insulating materials and conductive materials may be formed over the transistor 150 and may be patterned to make electrical contact to portions of the transistor 150, for example, not shown. The semiconductor device 100 may be annealed to activate the dopants implanted during the various implantation steps, for example.

In the embodiment shown in FIGS. 1, 2A, and 2B through 8, the novel re-fill of STI regions in accordance with embodiments of the present invention is implemented in an early eSiGe scheme, wherein after the formation of first sidewall spacers 112, the source and drain regions are recessed and epitaxially filled with a compound semiconductive material 122 such as eSiGe. The liner 128 and fill material 130 are used to fill the recesses 120 in the top of the STI regions 104, and the liner 128 is also used to form second sidewall spacers 128 on the sidewalls of the first sidewall spacers 112, as shown in FIGS. 7 and 8. Embodiments of the present invention may also be implemented in late eSiGe schemes and at other points in the manufacturing process of transistors, which will next be described.

FIG. 9 shows a cross-sectional view of a semiconductor device 100 in accordance with a preferred embodiment of the present invention, wherein the liner 128 is removed from sidewalls of a gate 108 and gate dielectric 106 after re-filling the STI regions 152, e.g., after the step shown in FIG. 6. The etch process 140 of the liner 128 in this embodiment may comprise an isotropic etch process, for example, that also removes the liner 128 from sidewalls of the first sidewall spacers 112, leaving the structure shown in FIG. 9. The etch process 140 preferably comprises a wet etch in some embodiments, for example. A second sidewall spacer material may then be formed over the entire workpiece 102, e.g., over the fill material 130 over the STI regions 104, over the source and drain regions 122, over the sidewalls of the first sidewall spacers 112, and the top of the gate 108. The second sidewall spacer material may be substantially conformal as deposited, for example, and may comprise similar materials described for the first sidewall spacers 112 and/or the liner 128, for example. The second sidewall spacer material is anisotropically etched to remove the second sidewall spacer material from top surfaces of the workpiece 102 and the gate 108, leaving the second sidewall spacer material on sidewalls of the first sidewall spacers, forming second sidewall spacers 145, as shown in phantom in FIG. 9. Processing of the semiconductor device 100 may then be continued as described with reference to FIG. 8, for example, such as forming third sidewall spacers 144 over the second sidewall spacers 145, and siliciding the source and drain regions 122, as shown in FIG. 8.

Figure 10:
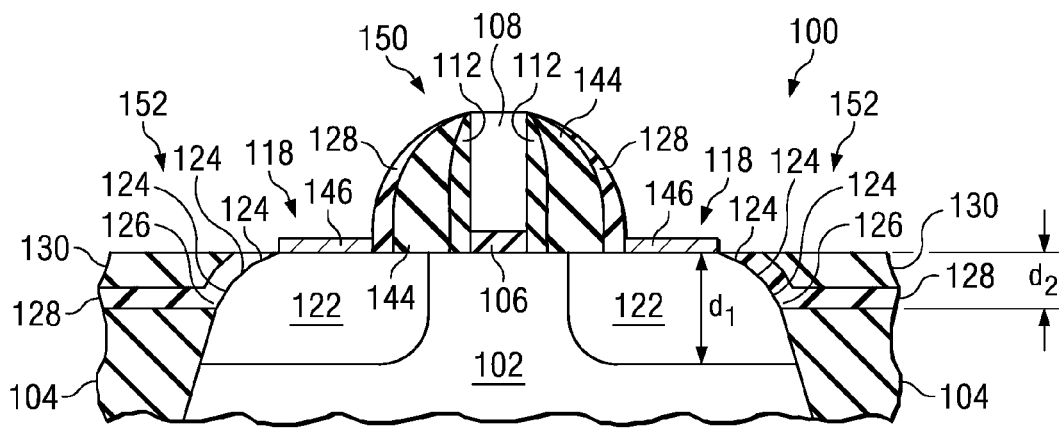
FIG. 10 shows an embodiment of the present invention after silicide is formed over the source and drain regions of the transistor.

FIG. 10 shows a cross-sectional view of a semiconductor device 100 in accordance with another preferred embodiment of the present invention, wherein the recessed STI regions 152 are re-filled before forming silicide 146 over source and drain regions 122, e.g., immediately before forming the silicide 146. In this embodiment, the order of the manufacturing process flow may be as follows, as an example: first, the gate 108 and gate dielectric 106 are patterned; second, first sidewall spacers 112 are formed on sidewalls of the gate 108 and the gate dielectric 106; third, temporary sidewall spacers (not shown; see disposable sidewall spacers 114 in FIG. 1) are formed on sidewalls of the first sidewall spacers 112; fourth, the source and drain regions are recessed and refilled with epitaxially grown semiconductive material 122; fifth, the temporary sidewall spacers are removed; sixth, the temporary sidewall spacers are replaced with permanent second sidewall spacers (e.g., such as sidewall spacers 145 shown in phantom in FIG. 9); seventh, third sidewall spacers 144 are formed over the first sidewall spacers 112 (or over second sidewall spacers 145, if present), eighth, the liner 128 is formed over the recessed STI regions 104 over the top of the source and drain regions 122, sidewalls of the third sidewall spacers 144, and the top of the gate 108; ninth, the fill material 130 is deposited over the entire workpiece 102; tenth; the liner 128 and the fill material 130 are removed from at least a portion of the workpiece 102, leaving the liner 128 and fill material 130 in the recesses 120 at the top of the STI regions; and eleventh, forming the silicide 146 on the source and drain regions 122, and also optionally over the gate 108, not shown. Alternatively, the manufacturing process flow may comprise alternative processing schemes, for example.

Note that in the embodiment shown in FIG. 10, optionally, the disposable sidewall spacers (not shown in FIG. 10; see disposable sidewall spacers 114 in FIG. 1) may not be replaced, as shown. The sidewall spacers 144 shown in FIG. 10 may function as second sidewall spacers, and the liner 128 may function as third sidewall spacers in this embodiment, for example. Alternatively, second sidewall spacers 145 (see FIG. 9) may be formed to replace the disposable sidewall spacers shown in FIG. 1, also not shown in FIG. 10. Third sidewall spacers 144 are then formed over the second sidewall spacers 145. The liner 128 may be left remaining in the structure, as shown in FIG. 10, or the liner 128 may be removed from over the third sidewall spacers 144.

Figure 11:
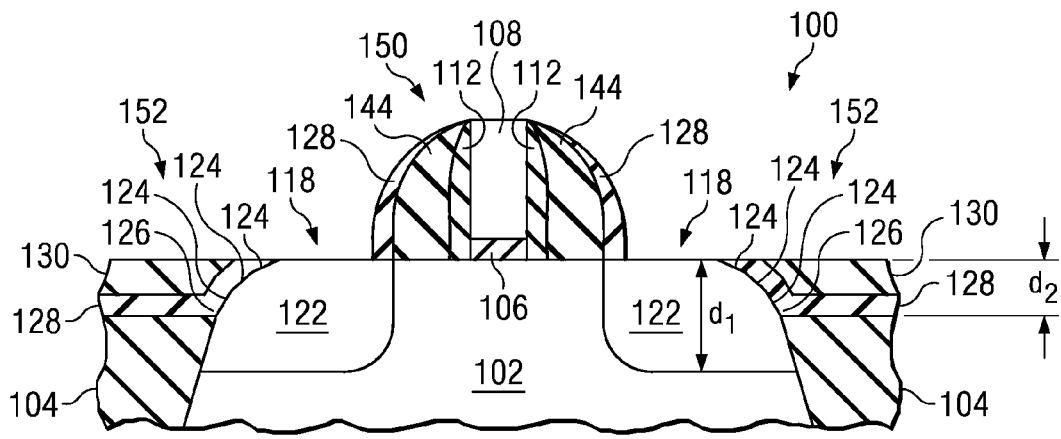
FIG. 11 shows a cross-sectional view of an embodiment of the present invention implemented in a late eSiGe scheme for manufacturing a transistor.

FIG. 11 shows a cross-sectional view of a semiconductor device 100 in accordance with yet another preferred embodiment of the present invention, wherein the recessed STI regions are re-filled in a late eSiGe scheme. The source and drain regions are recessed and refilled with a semiconductive material 122 after the formation of third sidewall spacers 144 in this embodiment. Disposable sidewall spacers (see spacers 114 in FIG. 1) may be replaced with second sidewall spacers 145 as shown in phantom in FIG. 9 in this embodiment, for example (not shown). Or, the disposable sidewall spacers formed over the first sidewall spacers may be left remaining in the structure (also not shown). After the recessed source and drain regions are refilled with the semiconductive material 122, recessed regions of the STI regions 104 are refilled with the liner 128 and fill material 130 described herein. A portion of the liner 128 may be left remaining on the sidewalls of the third sidewall spacers 144, as shown, or alternatively, the liner 128 may be removed.

Note that in the embodiment shown in FIG. 11, optionally, the temporary sidewall spacers (not shown) may not be replaced, as shown. The sidewall spacers 144 shown in FIG.

11 may function as second sidewall spacers, and the liner 128 may function as third sidewall spacers in this embodiment, for example.

Figure 12:
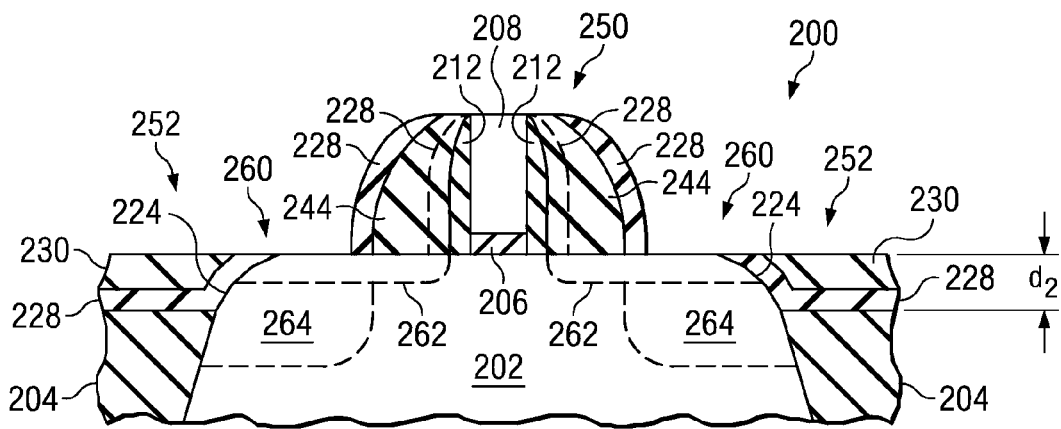
FIG. 12 illustrates an embodiment of the present invention implemented in a planar transistor device.

FIG. 12 shows a cross-sectional view of a semiconductor device 200 in accordance with a preferred embodiment of the present invention, wherein the novel liner 228 and fill material 230 described herein are used to re-fill recessed STI regions 252 in a planar transistor device 250. In this embodiment, the source and drain regions 260 of the transistor 250 are not recessed and refilled with a semiconductive material, as described in the previous embodiments herein. Like numerals are used for the various elements that were described in FIGS. 1, 2A, and 2B through 11. To avoid repetition, each reference number shown in FIG. 12 is not described again in detail herein. Rather, similar materials x02, x04, x06, x08, etc. . . . are preferably used for the various material layers shown as were described for FIGS. 1, 2A, and 2B through 11, where x=1 in FIGS. 1, 2A, and 2B through 11, and x=2 in FIG. 12. As an example, the preferred and alternative materials and dimensions described for the liner 128 and fill material 130 in the description for FIGS. 1, 2A, and 2B through 11 are preferably also used for the liner 228 and fill material 230 of FIG. 12.

In the embodiment shown in FIG. 12, source and drain regions 260 of the semiconductor device 200 are formed within the workpiece 202 using implantation processes. For example, the top surface of the workpiece 202 may be implanted with dopants to form pocket implants, halo implants, or double-diffused regions, for example. FIG. 12 shows a cross-sectional view of a semiconductor device 200 in accordance with a preferred embodiment of the present invention after shallow and deep implantation processes used to form the source and drain regions 260, respectively.

After the formation of first sidewall spacers 212, the workpiece 202 is implanted with dopants to form shallow implantation regions 262. After second and/or third sidewall spacers (represented by spacers 244 in FIG. 12), a deep implantation process is used to form deep implantation regions 264 in the workpiece 202. Note that the liner 228 and fill material 230 may be formed after the first sidewall spacers 212 are formed, as shown in phantom, or the liner 228 and fill material 230 may be formed after the sidewall spacers 244 are formed. The liner 228 may be left remaining over the first sidewall spacers 212, as shown in phantom, or over sidewall spacers 244, as shown. Alternatively, the liner 228 may be removed, for example. Anneal processes may be used to drive the dopants implanted into the workpiece 202 in regions 262 and 264 further into the workpiece 202, for example, not shown.

Embodiments of the present invention may be implemented in PMOS transistors or NMOS transistors. Embodiments may be implemented in both a PMOS and NMOS transistor of a CMOS device, or in a PMOS device but not an NMOS device of a CMOS device, and vice versa. For example, embodiments of the present invention may also be implemented in a CMOS device, on either the PMOS FET or the NMOS FET, or both, of the CMOS device. One type of transistor (e.g., NMOS FETs) of a semiconductor device 100/200 may be masked while the other type of transistor (e.g., PMOS FETs) is processed. In some embodiments, both types of transistors may be processed simultaneously, for example.

Embodiments of the present invention may be implemented in applications where transistors are used, as described herein and shown in the figures. One example of a memory device that embodiments of the present invention may be implemented in that uses both PMOS FET's and NMOS FET's is a static random access memory (SRAM) device. A typical SRAM device includes arrays of thousands of SRAM cells, for example. Each SRAM cell may have four or six transistors (for example). A commonly used SRAM cell is a six-transistor (6T) SRAM cell, which has two PMOS FET's interconnected with four NMOS FET's. The novel methods of forming transistors described herein may be implemented in the transistors of SRAM devices and other memory devices such as dynamic random access memory (DRAM) devices or flash memory devices, as examples. Embodiments of the present invention may also be implemented in logic devices or in analog devices, as examples.

Embodiments of the present invention include semiconductor devices 100 and 200 and transistors 150 and 250 that include isolation regions 152 and 252 that are refilled with the novel liners 128 and 228 and fill materials 130 and 230 described herein. Embodiments of the present invention also include methods of fabricating the semiconductor devices 100 and 200 and transistors 150 and 250 described herein, for example.

Advantages of embodiments of the invention include providing novel structures and methods for forming transistors 150 and 250 that have improved isolation. Filling recessed STI regions 152 and 252 with the liners 128 and 228 and fill material 130 and 230 prevents shorts and junction leakage from occurring when a silicide 146 (see FIGS. 8 and 10) is formed over the source and drain regions 122 and 260. The novel liners 128 and 228 and fill material 130 and 230 reduce leakage from STI regions 152 and 252 and from source and drain regions 122 and 260 of transistors 150 and 250.

In embodiments wherein the source and drain regions are recessed and filled with a semiconductive material 122, the stress of channel regions beneath the gate dielectric 106 may be altered using the semiconductive material 122, improving the transistor 150 and device performance.

Embodiments of the present invention may be implemented in planar transistors 250, as shown in FIG. 12, or in transistors 150 having compound semiconductive materials 122 formed in the source and drain regions, as shown in FIGS. 1, 2A, and 2B through 11. Embodiments of the present invention may be implemented in early eSiGe or late eSiGe processes, for example.

The novel liners 128 and 228 described herein may also advantageously be used as a sidewall spacer material in some embodiments, for example, eliminating the need to form sidewall spacers in an additional manufacturing step.

Embodiments of the present invention also prevent erosion of faceted surfaces of epitaxially grown source and drain regions 122 during subsequent wet etch and RIE processes.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to

What is claimed is:

1. A method of manufacturing a semiconductor device, the method comprising:
   providing a semiconductor wafer;
   forming at least one isolation structure within the semiconductor wafer;
   forming at least one feature over the semiconductor wafer;
   removing a top portion of the at least one isolation structure;
   forming a liner over the semiconductor wafer, the at least one feature, and the at least one isolation structure;
   forming a fill material over the liner;
   removing the fill material and the liner from over at least a portion of a top surface of the semiconductor wafer; and
   after removing the fill material and the liner, forming a silicide on a portion of the top surface of the semiconductor wafer.

2. The method according to claim 1, wherein removing the top portion of the at least one isolation structure comprises forming a recess in the at least one isolation structure below the top surface of the semiconductor wafer, and wherein removing the fill material and the liner from over at least a portion of a top surface of the semiconductor wafer comprises leaving the liner and the fill material within the recess in the at least one isolation structure.

3. The method according to claim 1, wherein removing the top portion of the at least one isolation structure is performed using an etching process.

4. The method according to claim 1, wherein removing the top portion of the at least one isolation structure occurs during a cleaning process.

5. The method according to claim 1, wherein removing the fill material and the liner from over at least a portion of a top surface of the semiconductor wafer comprises completely removing the fill material and the liner from over the top surface of the semiconductor wafer.

6. The method according to claim 1, wherein the at least one feature comprises sidewalls, and wherein removing the fill material and the liner from over at least a portion of a top surface of the semiconductor wafer comprises leaving a portion of the liner on the sidewalls of the at least one feature.

7. A method of manufacturing a semiconductor device, the method comprising:
   providing a workpiece;
   forming at least one isolation structure within the workpiece;
   forming a gate dielectric over the workpiece;
   forming a gate over the gate dielectric, the gate and the gate dielectric comprising sidewalls;
   removing a top portion of the at least one isolation structure, forming a recess in the at least one isolation structure;
   forming a liner over the workpiece, the gate, the sidewalls of the gate and gate dielectric, and the recessed at least one isolation structure;
   forming a fill material over the liner;
   removing the fill material and the liner at least from over a portion of a top surface of the workpiece, leaving the liner and the fill material within the recess in the at least one isolation structure; and
   after removing the fill material and the liner, forming a silicide on a portion of the top surface of the workpiece.

8. The method according to claim 7, further comprising forming a source region and a drain region in the workpiece proximate the gate and the gate dielectric.

9. The method according to claim 8, wherein forming the source region and the drain region comprises implanting at least one dopant into the workpiece proximate the gate and the gate dielectric.

10. The method according to claim 8, wherein removing the fill material and the liner at least from over the top surface of the workpiece comprises: first, removing a portion of the fill material from over the liner over the gate using a chemical-mechanical polish process; second, etching away the fill material using a first etch process until the liner over the workpiece is exposed; and third, etching away the liner over the source region and the drain region using a second etch process.

11. The method according to claim 7, further comprising forming at least one sidewall spacer over the sidewalls of the gate and the gate dielectric, after forming the gate over the gate dielectric.

12. The method according to claim 7, wherein forming the at least one isolation structure comprises forming a plurality of shallow trench isolation (STI) regions, deep trench (DT) isolation regions, and/or field oxide isolation regions.

13. A method of manufacturing a transistor, the method comprising:
   providing a workpiece, the workpiece comprising a top surface;
   forming at least one isolation structure within the workpiece;
   forming a gate dielectric material over the workpiece;
   forming a gate material over the gate dielectric material;
   patterning the gate material and the gate dielectric material to form a gate and a gate dielectric, the gate and the gate dielectric comprising sidewalls;
   forming at least one sidewall spacer over the sidewalls of the gate and the gate dielectric;
   forming a source region and a drain region in the workpiece proximate the at least one sidewall spacer;
   removing a top portion of the at least one isolation structure, forming a recess in the at least one isolation structure beneath the top surface of the workpiece;
   forming a liner over the source region, the drain region, the gate, the at least one sidewall spacer, and the recessed at least one isolation structure;
   forming a fill material over the liner;
   removing the fill material and the liner at least from over a portion of the top surface of the workpiece, leaving the liner and the fill material within the recess in the at least one isolation structure; and
   after removing the fill material and the liner, forming a suicide on a portion of the top surface of the workpiece.

14. The method according to claim 13, wherein forming the source region and the drain region comprises forming recesses in the workpiece proximate the gate and the gate dielectric, and filling the recesses in the workpiece with a semiconductive material.

15. The method according to claim 14, wherein filling the recesses in the workpiece with the semiconductive material comprises forming SiGe; carbon-doped SiGe; SiGe doped with As, C, P, or combinations thereof; SiC; or SiC doped with B.

16. The method according to claim 14, wherein filling the recesses in the workpiece with the semiconductive material comprises forming a source region and a drain region comprising faceted surfaces proximate the at least one isolation structure.

17. The method according to claim 16, wherein forming the source region and the drain region comprises forming a source region and a drain region wherein the faceted surfaces comprise angled downwardly sloping sidewalls, and wherein removing the fill material and the liner at least from over the top surface of the workpiece, leaving the liner and the fill material within the recess in the at least one isolation structure comprises leaving the liner and the fill material within the recess in the at least one isolation structure adjacent the angled downwardly sloping sidewalls of the faceted surfaces of the source region and the drain region.

18. The method according to claim 13, wherein forming the at least one sidewall spacer over the sidewalls of the gate and the gate dielectric comprises forming first sidewall spacers over the sidewalls of the gate and gate dielectric.

19. The method according to claim 18, wherein the first sidewall spacers comprise sidewalls, further comprising forming temporary sidewall spacers over the sidewalls of the first sidewall spacers, before forming the source region and the drain region, and removing the temporary sidewall spacers before forming the liner.

20. The method according to claim 18, wherein the first sidewall spacers comprise sidewalls, further comprising forming second sidewall spacers over the sidewalls of the first sidewall spacers, before or after forming the source region and the drain region in the workpiece.

21. The method according to claim 20, wherein forming the second sidewall spacers comprises: anisotropically etching the liner, leaving a portion of the liner disposed over the sidewalls of the first sidewall spacers, wherein the portion of the liner disposed over the sidewalls of the first sidewall spacers forms the second sidewall spacers; or removing the liner, and forming the second sidewall spacers over the first sidewall spacers.

22. The method according to claim 20, wherein forming the second sidewall spacers comprises forming second sidewall spacers comprising sidewalls, further comprising forming third sidewall spacers over the sidewalls of the second sidewall spacers.

23. A method of manufacturing a transistor, the method comprising:
forming an isolation structure within a semiconductor body;
forming a gate dielectric over the semiconductor body proximate the isolation structure;
forming a gate over the gate dielectric, the gate and the gate dielectric having sidewalls;
forming a source/drain region within the semiconductor body between the isolation structure and the gate dielectric and the gate, wherein the isolation structure comprises a first fill material in a lower portion, a liner disposed over the first fill material and on sidewalls of the workpiece in an upper portion of the isolation structure, and a second fill material disposed over the liner; and
after forming the isolation structure comprising the liner and the second fill material, forming a suicide on a top portion of the source/drain region.

24. The method according to claim 23, wherein the liner comprises a material with a dielectric constant greater than about 3.9, and wherein the second fill material comprises an oxide material.

25. The method according to claim 23, wherein the liner comprises a material with a dielectric constant greater than about 3.9, and wherein the second fill material comprises a low k dielectric material having a dielectric constant of about 3.9 or less.

26. The method according to claim 23, wherein the liner comprises a first layer and a second layer disposed over the first layer, wherein the first layer comprises about 10 to 50 Angstroms of silicon dioxide, and wherein the second layer comprises about 100 Angstroms or less of silicon nitride, a high k dielectric material having a dielectric constant of greater than about 3.9, or amorphous carbon.

27. The method according to claim 23, further comprising forming a silicide over at least a portion of the source/drain region.

28. The method according to claim 23, wherein the transistor comprises a p channel metal oxide semiconductor (PMOS) field effect transistor (FET).

29. The method according to claim 23, wherein the transistor comprises an n channel metal oxide semiconductor (NMOS) field effect transistor (FET).

* * * * *

UNITED STATES PATENT AND TRADEMARK OFFICE
CERTIFICATE OF CORRECTION

PATENT NO. : 7,652,336 B2  Page 1 of 1
APPLICATION NO. : 11/834398
DATED : January 26, 2010
INVENTOR(S) : Han et al.

It is certified that error appears in the above-identified patent and that said Letters Patent is hereby corrected as shown below:

In Col. 17, line 56, Claim 7, delete "m" and insert --in--.
In Col. 18, line 41, Claim 13, delete "m" and insert --in--.
In Col. 18, line 52, Claim 13, delete "suicide" and insert --silicide--.
In Col. 20, line 14, Claim 23, delete "suicide" and insert --silicide--.

Signed and Sealed this

Eighteenth Day of May, 2010

David J. Kappos
*Director of the United States Patent and Trademark Office*